(12) United States Patent
Kawabata et al.

(10) Patent No.: US 7,859,914 B2
(45) Date of Patent: Dec. 28, 2010

(54) NON-VOLATILE MEMORY DEVICE, NON-VOLATILE MEMORY SYSTEM AND CONTROL METHOD FOR THE NON-VOLATILE MEMORY DEVICE IN WHICH DRIVING ABILITY OF A SELECTOR TRANSISTOR IS VARIED

(75) Inventors: Shozo Kawabata, Inuyama (JP); Sooyong Park, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 477 days.

(21) Appl. No.: 12/058,471

(22) Filed: Mar. 28, 2008

(65) Prior Publication Data
US 2008/0247233 A1    Oct. 9, 2008

(30) Foreign Application Priority Data
Apr. 3, 2007    (JP) .............................. 2007-097578

(51) Int. Cl.
G11C 16/04    (2006.01)
G11C 16/06    (2006.01)

(52) U.S. Cl. ........................ 365/189.02; 365/185.11; 365/185.16; 365/230.03; 365/238.5; 365/239

(58) Field of Classification Search ............ 365/185.11, 365/185.05, 185.16, 189.02, 230.02, 239, 365/238.5, 230.03
See application file for complete search history.

(56) References Cited

U.S. PATENT DOCUMENTS 5,657,274 A * 8/1997 Hibino .................. 365/230.04
5,959,892 A * 9/1999 Lin et al. ............... 365/185.28

FOREIGN PATENT DOCUMENTS

| JP | 5006654 A | 1/1993 |
| JP | 6223588 A | 8/1994 |
| JP | 6333389 A | 12/1994 |
| JP | 7254288 A | 10/1995 |
| JP | 7264842 A | 10/1995 |
| JP | 11297080 A | 10/1999 |
| JP | 2000223673 A | 8/2000 |
| JP | 2001148192 A | 5/2001 |
| JP | 2003123494 A | 4/2003 |
| JP | 2006128594 A | 5/2006 |

* cited by examiner

Primary Examiner—J. H. Hur

(57) ABSTRACT

The control method includes a step of varying driving ability of a selector transistor which selects a diffusion layer in a selected memory cell and a diffusion layer of at least one non-selected memory cell which adjoins to the selected memory cell when the selected memory cell makes transition from a memory cell at one end to a memory cell at other end within a memory block.

13 Claims, 10 Drawing Sheets

| COLUMN ADDRESS | NUMBER OF TRANSISTORS TO BE SWITCHED | | | | LOAD INCREMENT |
|---|---|---|---|---|---|
| | LOCAL Y-PASS GATE | (NUMBER OF CHANGES) | GLOBAL Y-PASS GATE | (NUMBER OF CHANGES) | |
| 6 | 4 | Δ1 | 4 | Δ2 | Δ1 |
| 7 | 4 | Δ1 | 4 | | |
| 8 | 4 | | 4 | Δ3 | |

FIG. 10

NON-VOLATILE MEMORY DEVICE, NON-VOLATILE MEMORY SYSTEM AND CONTROL METHOD FOR THE NON-VOLATILE MEMORY DEVICE IN WHICH DRIVING ABILITY OF A SELECTOR TRANSISTOR IS VARIED

CROSS-REFERENCE TO RELATED APPLICATIONS

The present invention is based on Japanese Patent Application No. 2007-097578 filed on Apr. 3, 2007, the entire disclosure of which is hereby incorporated by reference.

TECHNICAL FIELD

The invention relates to a nonvolatile memory device, non-volatile memory system and a control method for the non-volatile memory device. More particularly, the invention relates to the technique of reducing consumption current and shortening access time during an operation of reading out data from a memory cell having an insulating trap layer.

BACKGROUND OF THE INVENTION

In Published Japanese translation of PCT application No. 2005-537597, a flash memory device which employs the MirrorBit (registered trade mark) architecture is disclosed. In the MirrorBit architecture, two bits can be stored per memory cell. For reading out a memory cell, two column lines adjacent to the memory cell and auxiliary two column lines located outside of said two column lines are selected. One of the two column lines is connected to ground and the other one is connected to a voltage source to provide basic sensing current for the memory cell. Also, the auxiliary two column lines are respectively connected to ground and the voltage source to reduce error current. In this manner, four column lines are selected. Such column line selection is carried out by a diffusion bit line selection unit of a four-column Y-decoder and a metal bit line selection unit of the four-column Y-decoder. The connection points of column lines are selected by a source selector.

In a burst operation to sequentially access adjacent memory cells, when using an access method of four-column selection, an additional column line must be selected for a newly accessed memory cell. Also, a connection point of a column line common with the preceding memory cell and the newly accessed memory cell needs switching between a ground potential and a voltage source. Thus, at least one switching element must be operated in the diffusion bit line selection unit and in the metal bit line selection unit. Further, at least one switching element must be operated in the source selector. Therefore, two or more switching elements must be performed in total.

However, in the burst operation, there occurs a non-sequential access operation, such as accessing from a memory cell located at one end to a memory cell located at the other end of a block as one unit for a sequential access operation. In this time, the four line column selection access method requires selection of two additional column lines as well as two auxiliary column lines. Thus, at least four switching elements must be operated in the diffusion bit line selection unit, the metal bit line selection unit, and the source selector. This means that the number of switching elements varies between in a sequential access operation and in a non-sequential access operation. Therefore, load capacity of circuits such as the diffusion bit line selection unit, the metal bit line selection unit, and the source selector varies in accordance with transition of column address.

For the above-described reason, circuits such as the diffusion bit line selection unit were conventionally operated based on the load capacity required during a non-sequential access operation which accompanies the largest load. Consequently, driving ability during the sequential access operation with less load capacity becomes redundant, leading to increase in consumption current. Also, during a sequential access operation, excessively boosted voltage needs regulating into a predetermined voltage so that regulating time increases and hence access time increases.

SUMMARY OF THE INVENTION

The present invention has been made taking account of the related art described above and an object of the invention is therefore to provide a non-volatile memory device and non-volatile memory system capable of reducing consumption current and shortening access time during a burst operation by a multi-column selection access method wherein, for reading out from a memory cell, two column lines adjacent to said memory cell and plural auxiliary column lines located outside of said two column lines are selected.

In order to achieve the above object, according to the first aspect of the invention, there is provided a non-volatile memory device comprising plural memory cells connected in series, wherein a unit of memory block with the plural memory cells is defined by a boundary at which address allocation regularity of the plural memory cells changes from a shifting manner to a mirroring manner, and the non-volatile memory device further comprises a control circuit which varies driving ability of a selector transistor which selects a diffusion layer in a selected memory cell and a diffusion layer of at least one non-selected memory cell which adjoins to the selected memory cell when the selected memory cell makes transition from a memory cell at one end to a memory cell at other end within the memory block.

According to the first aspect of the invention, there is also provided a control method of a non-volatile memory device comprising plural memory cells connected in series, when a unit of memory block in the plural memory cells is defined by a boundary at which address allocation regularity of the plural memory cells changes from a shifting manner to a mirroring manner, the control method comprising a step of varying driving ability of a selector transistor which selects a diffusion layer in a selected memory cell and a diffusion layer of at least one non-selected memory cell which adjoins to the selected memory cell when the selected memory cell makes transition from a memory cell at one end to a memory cell at other end within the memory block.

According to the first aspect of the invention, there is also provided a non-volatile memory system comprising: plural memory blocks each of which is a unit defined by a boundary at which address allocation regularity of the plural memory cells connected in series changes from a shifting manner to a mirroring manner; and a control circuit which varies driving ability of a selector transistor which selects a diffusion layer in a selected memory cell and a diffusion layer of at least one non-selected memory cell which adjoins to the selected memory cell when the selected memory cell makes transition from a memory cell at one end to a memory cell at other end within the memory block.

In the first aspect of the invention, the non-volatile memory device, the non-volatile memory system and the control method of the non-volatile memory device are provided with a plurality of blocks which are formed with serially connected memory cells. Two bits can be stored per memory cell, to which two addresses are allocated. A unit of memory block is defined by a boundary at which address allocation regularity of the plural memory cells changes from a shifting manner to a mirroring manner. By sequentially accessing adjacent memory cells in one unit of memory block, a burst access read out operation is performed. The burst access operation according to the first aspect of the invention includes a sequential access operation of accessing adjacent memory cells and a non-sequential access operation of accessing from a memory cell located at one end of a memory block to a memory cell located at the other end of the memory block.

Owing to a selector transistor, the same bias is applied to a diffusion layer of a selected memory cell and a diffusion layer of at least one non-selected memory adjacent to the selected memory cell. Accordingly, it becomes possible to apply bias further to a diffusion layer of at least one non-selected memory adjacent to the selected memory cell, thereby cutting down leakage current and accurately detecting current in the selected memory cell. The step of varying driving ability of the controller circuit or the selector transistor variably controls driving ability of the selector transistor during a transition of the selected memory cell from one end to the other end of the memory block.

When performing a burst operation to sequentially access adjacent memory cells by using an access method of applying a bias, same as the one to be applied to as a diffusion layer of a selected memory, to a diffusion layer of at least one non-selected memory cell adjacent to selected memory cell, another diffusion layer must be selected for the memory cell newly accessed as well as a connection point of the diffusion layer common with the preceding memory cell and the newly accessed memory cell needs switching between a ground potential and a voltage source. Thus, at least two or more selector transistors must be operated.

In the burst operation, however, there occurs a non-sequential access operation, such as accessing from a memory cell located at one end to a memory cell located at the other end of a block as one unit for a sequential access operation. In the access method of applying a bias, same as the one to be applied to the diffusion layer of the selected memory cell, to at least one non-selected memory cell adjacent to the selected memory cell, it is required to select a diffusion layer of the non-selected memory cell outside of the selected memory cell as well as two diffusion layers of the selected memory cell. Therefore, at least three selector transistors must be operated. In other words, the number of selector transistors to be operated varies between in a sequential access operation and in a non-sequential access operation. Then, load capacity of the selector transistor varies in accordance with transition of column address.

In view of the situation, driving ability of a selector transistor is made to increase along access memory transition from one end to the other end of a memory block. Consequently, driving ability appropriate to a sequential access can be obtained at the time of a sequential access operation in which the load capacity of a selector transistor is small, and driving ability can be made to increase in proportion to an increased value of the load capacity at the time of a non-sequential access operation in which the load capacity of a selector transistor is large. Accordingly, in accessing all the memory cells within a block, voltages can be appropriately boosted on each occasion of accessing the memory cells. This prevents increase in consumption current due to excessive boosting so that low power consumption can be achieved. Also, since adjusting time for further regulating the excessively boosted voltage to a predetermined voltage becomes unnecessary, speeding up of burst accessing can be achieved.

According to the invention, it is possible to provide a non-volatile memory device and non-volatile memory system capable of reducing consumption current and shortening access time required during a burst operation by a multi-column selection access method wherein, for reading out from a memory cell, two bit lines adjacent to the memory cell and auxiliary multiple bit lines located outside of the two bit lines are selected, and a control method of such non-volatile memory device.

BRIEF DESCRIPTION OF THE DRAWINGS

FIG. 10 is a table showing a change in the number of transistors to be operated in accordance with a predetermined transition of the column address coladd.

DESCRIPTION OF AN EXEMPLARY EMBODIMENT

Figure 1:
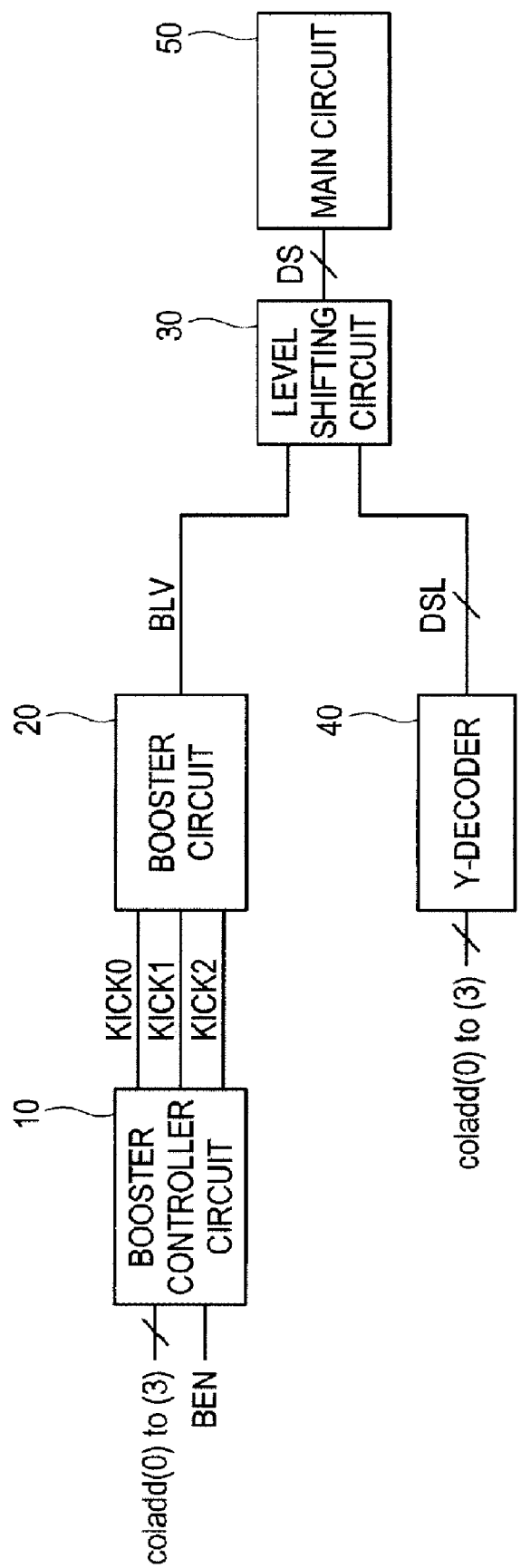
FIG. 1 is an overall block diagram of a non-volatile memory device 1.

Referring now to FIGS. 1 to 9, a non-volatile memory device, non-volatile memory system and a non-volatile memory device control method of the invention will be hereinafter described in detail according to preferred embodiments. FIG. 1 shows an overall block diagram of a non-volatile memory device 1 of the invention. The non-volatile memory deice 1 comprises a booster controller circuit 10, a booster circuit 20, a level shifting circuit 30, a Y-decoder 40, and a main circuit 50.

Figure 2:
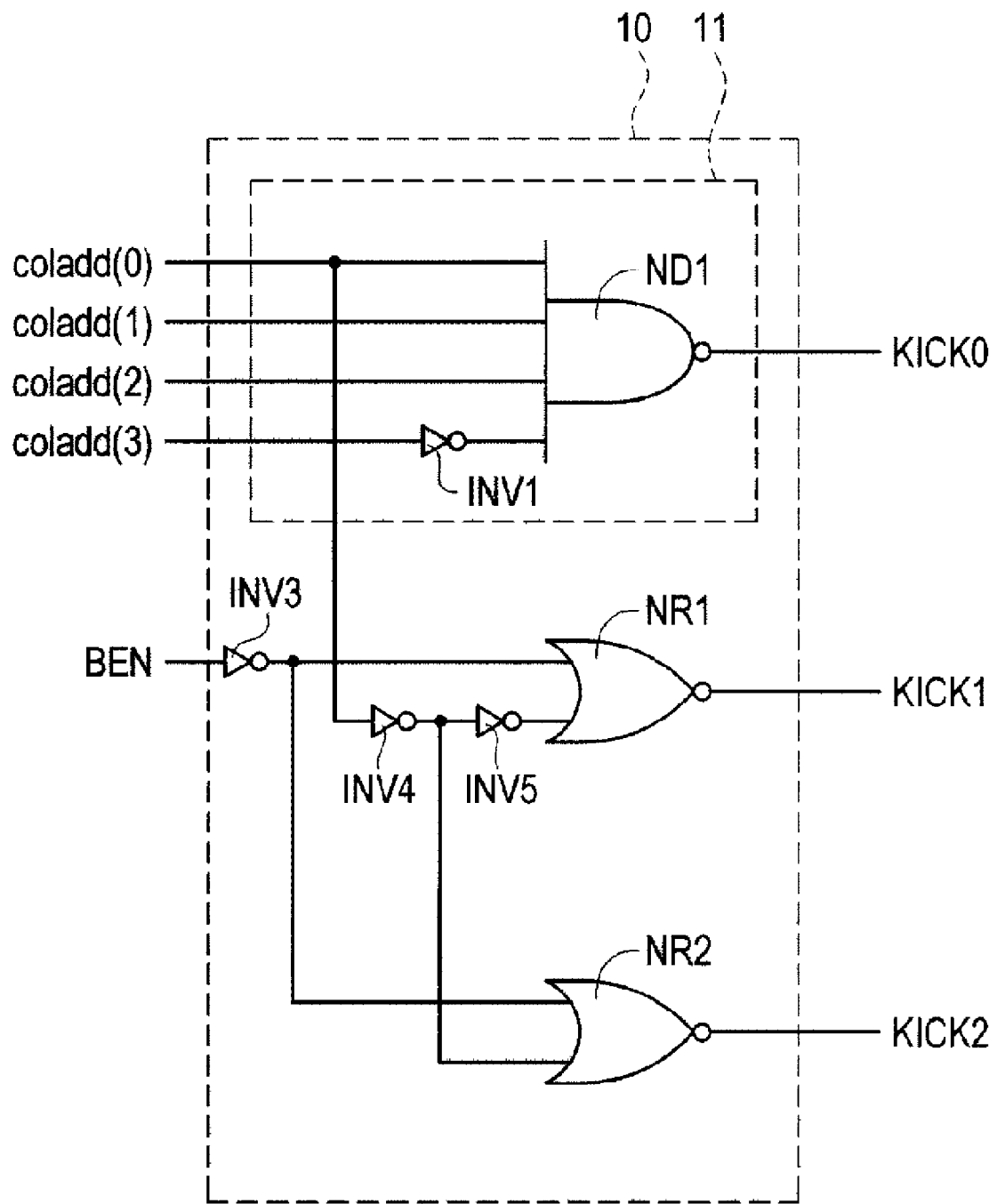
FIG. 2 is a circuit diagram of a booster controller circuit 10.

FIG. 2 shows a circuit diagram of the booster controller circuit 10. The booster controller circuit 10 comprises a KICK0 controller 11, NOR gates NR1 and NR2, inverters INV3 to INV5. To a NAND gate ND1 of the KICK0 controller 11, column addresses coladd(0) to (2) are inputted. Also to the NAND gate ND1, a column address coladd(3) is inputted through an inverter INV1. An output from the NAND gate ND1 is outputted as a kick signal KICK0.

To the NOR gate NR1, a boost enable signal BEN is inputted through the inverter INV3. Also, a column address coladd (0) is inputted to the NOR gate NR1 through the inverters INV4 and INV5. Next, a kick signal KICK1 is outputted from the NOR gate NR1. To the NOR gate NR2, the boost enable signal BEN inverted by the inverter INV3 and the column address coladd(0) inverted by the inverter INV4 are inputted. Then, a kick signal KICK2 is outputted from the NOR gate NR2.

Figure 3:
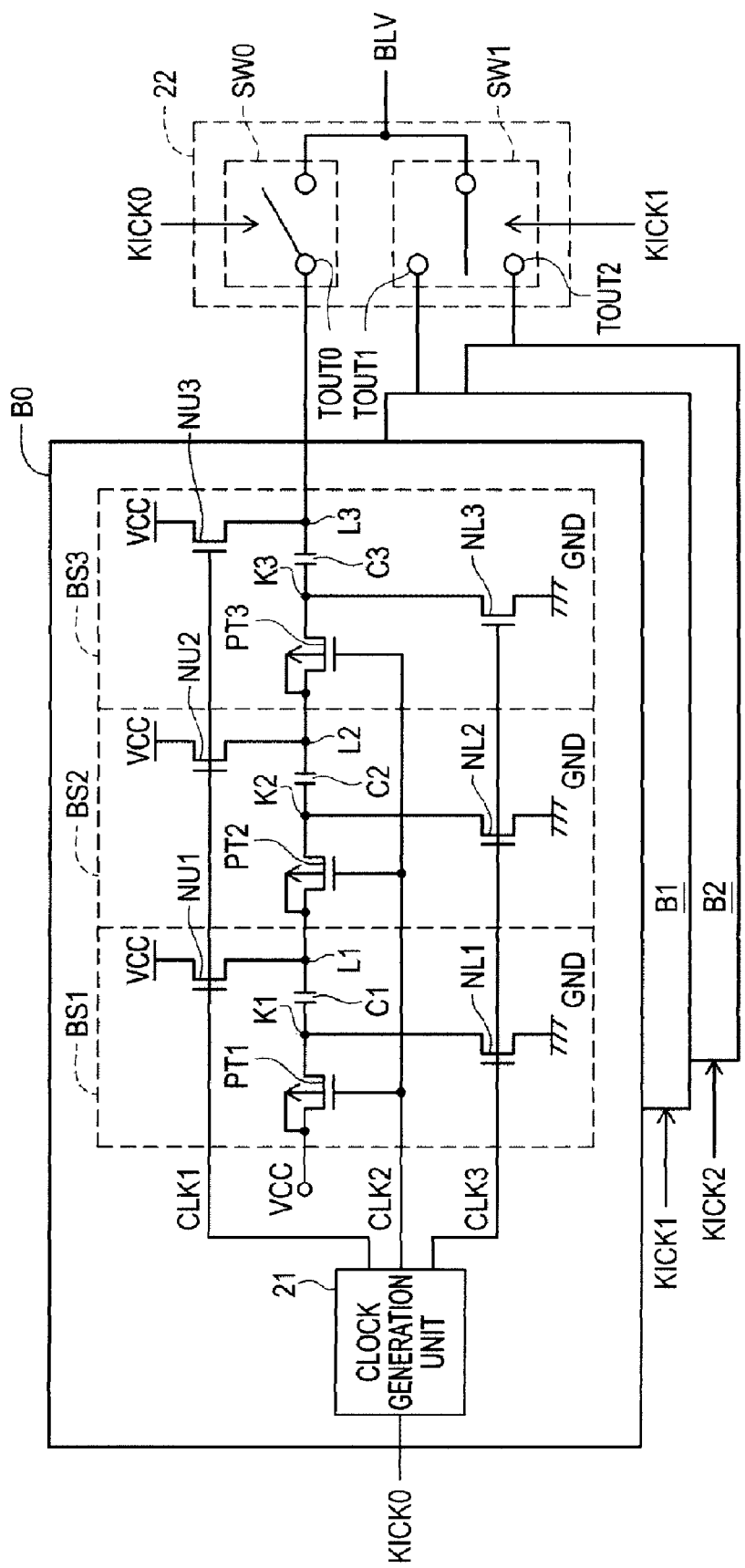
FIG. 3 is a circuit diagram of a booster circuit 20.

FIG. 3 shows a circuit diagram of a booster circuit 20 as an internal power supply circuit. The booster circuit 20 employs what is called a capacitor boosting method. The booster circuit 20 comprises boosting systems B0 to B2, to which the kick signals KICK0 to KICK2 are inputted, respectively.

The boosting system B0 will be explained. The boosting system B0 comprises a clock generation unit 21 and three boosting stages BS1 to BS3. The kick signal KICK0 is inputted to the clock generation unit 21. Clock signals CLK1 to CLK3 outputted from the clock generation unit 21 are inputted to the boosting stages BS1 to BS3. The boosting stage BS1 comprises a capacitor C1, nodes K1 and L1, nMOS transistors NU1 and NL1, and a pMOS transistor PT1. The capacitor C1 is connected between the node K1 and the node L1. A gate electrode of the nMOS transistor NU1 is connected to an input terminal of the clock signal CLK1, one diffusion layer is connected to a supply line of a power supply voltage VCC, and the other diffusion layer is connected to the node L1. A gate electrode of the nMOS transistor NL1 is connected to an input terminal of the clock signal CLK3, one diffusion layer is connected to the node K1, and the other layer is connected to a grounding line. Also, a source electrode of the pMOS transistor PT1 is connected to a supply line of the power supply voltage VCC, a drain electrode is connected to the node K1 and a gate electrode is connected to an input terminal of the clock signal CLK2. Since the boosting stages BS2 and BS3 are constructed as in the same manner as the boosting stage B1, their detailed explanations will not be given here.

The node L1 of the boosting stage BS1 is connected to the node K2 of the boosting stage BS2 through the pMOS transistor PT2. Also, the node L2 of the boosting stage BS2 is connected to the node K3 of the boosting stage B3 through the pMOS transistor PT3. Incidentally, the boosting systems B1 and B2 are constructed in the same manner as the boosting system B0, their detailed explanations will not be given here.

An output terminal TOUT0 of the boosting system B0 is connected to a switch SW0 of a switch unit 22 and an output terminal TOUT1 of the boosting system B1 and an output terminal TOUT2 of the boosting system B2 are connected to a switch SW1. The switches SW0 and SW1 receive kick signals KICK0 and KICK1 respectively. Output terminals of the switches SW0 and SW1 are connected in common to output a boost level BLV.

Column addresses coladd(0) to (3) are inputted to the Y-decoder 40 (FIG. 1). Decode signal group DSL at a VCC amplitude level is outputted from the Y-decoder 40 and inputted to the level shifting circuit 30. The decode signal group DSL consists of signals such as signals SECY(0) to SECY(7), signals SJ, SLJ, SRJ, DJ, DLJ, and DRJ. As will be described later, the signals SJ, SLJ, and SRJ select a grounding line ARVSS to connect to a bit line M3J and the signals DJ, DLJ and DRJ select a data line DATAB to connect to the bit line M3J. Signals SECY(0) to (7) select a local bit line MI to connect to a global bit line M3.

The level shifting circuit 30 is provided in accordance with each of the decode signal group DSL outputted from the Y-decoder 40. The level shifting circuit 30 receives the boost level BLV outputted from the booster circuit 20. The decode signal group DS which is level-shifted to an amplitude of the boost level BLV is outputted from the level shifting circuit 30.

Next, the main circuit 50 will be explained. In the main circuit 50, a group of flash cells is arranged in a rectangular array of rows (X-dimension) and columns (Y-dimension). Sources and drains of the flash cells are connected within a single row to form a serial chain. A common word line is connected to each gate in the row.

Figure 4:
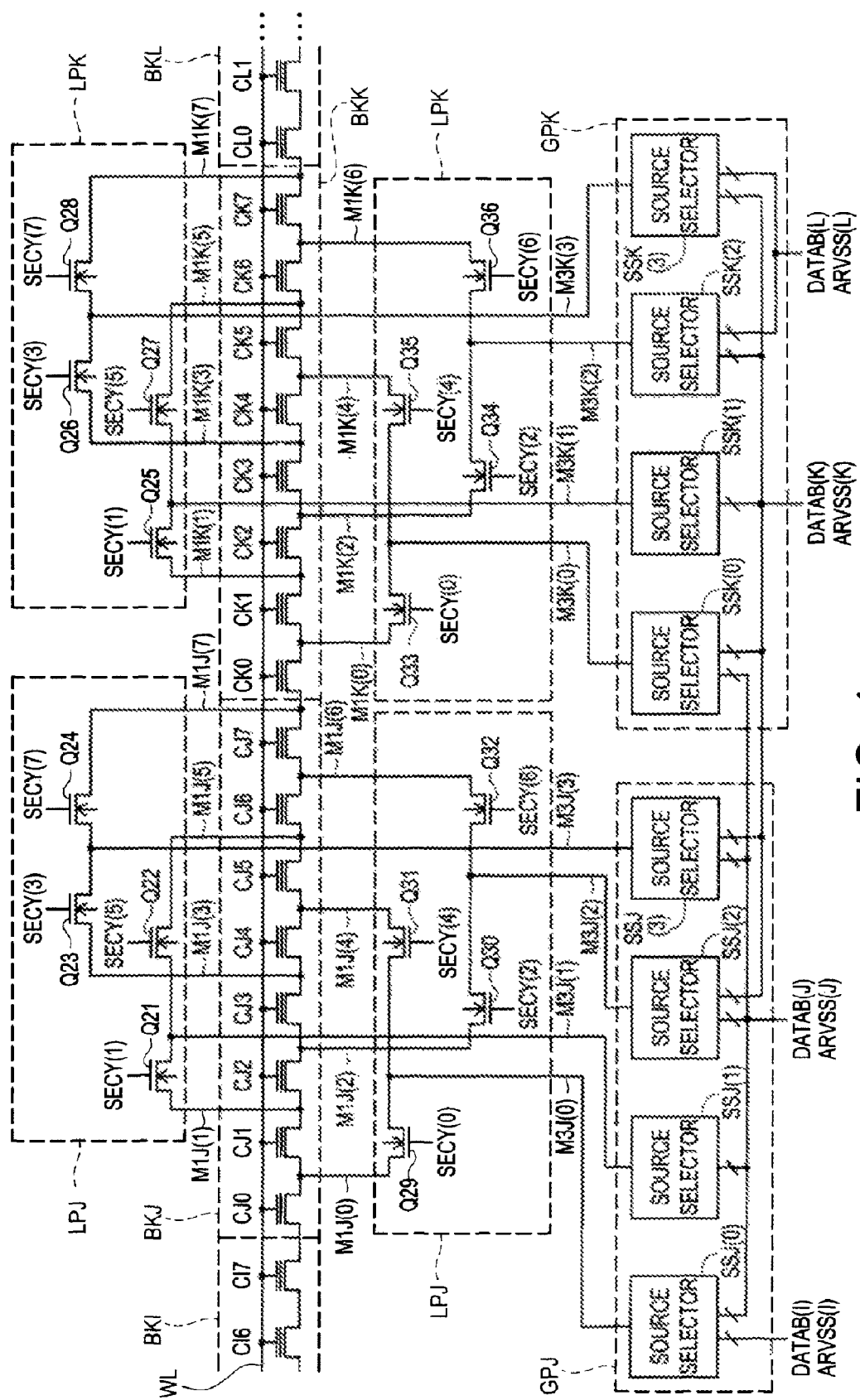
FIG. 4 is a partially enlarged view of a main circuit 50.

FIG. 4 illustrates a part of the linear chain of the flash cell in the main circuit 50, focusing on an I-block BKI, a J-block BKJ, a K-block BKK and an L-block BKL, local Y-pass gates LPJ and LPK, global Y-pass gates GPJ and GPK. The J-block BKJ consists of flash cells CJ0 to CJ7 and the K-block BKK consists of flash cells CK0 to CK7. Further, the I-block BKI is arranged adjacent to the J-block BKJ and the L-block BKL is arranged adjacent to the K-block BKK.

The flash cell is an NROM cell in which an insulating trap layer is configured by Nitride and the like, and is based on a MirrorBit (registered trademark) cell which is a symmetric transistor having selectable source and drain. In the flash cell, once an electron is stored into a first trap area provided at one side of the insulating trap layer, the electron keeps staying in the first trap area and does not move to a second trap area provided at the other side of a memory element. Accordingly, the flash cell is configured such that a bit can be stored in one or both of the first trap area and the second trap area in the insulating trap layer. In the embodiment, two bits can be stored in a single flash cell.

The J-block BKJ consists of flash cells CJ0 to CJ7 and also the K-block BKK consists of flash cells CK0 to CK7. The I-block BKI is arranged adjacent to the J-block BKJ, and the L-block BKL is arranged adjacent to the K-block BKK. Bit lines M1J(0) to M1J(7) as a metal layer are individually connected to each node between the adjacent flash cells in the J-block BKJ, and bit lines M1K(0) to M1K(7) are individually connected to each node between the adjacent flash cells in the K-block BKK. Further, the gates of the flash cells are connected to a common word line WL. An access operation such as a program operation and a read operation is performed on the eight cells of the J-block BKJ and that of the K-block BKK individually as a unit. Incidentally, each boundary of adjacent blocks is referred to a pattern boundary. In the J-block BKJ, flash cells CJ0 and CJ7 are individually located at pattern boundaries, and in the K-block BKK the flash cells CK0 and CK7 are individually located at pattern boundaries.

Next, the J-block BKJ will be explained. The local Y-pass gate LPJ and the global Y-pass gate GPJ are provided associated with the J-block BKJ. The local Y-pass gate LPJ and the global Y-pass gate GPJ constitute the four-column Y-decoder to be used for selecting column lines for a detection operation. Bit lines M3J(0) to M3J(3) as a metal layer are connected to the local Y-pass gate LPJ, to which signals SECY(0) to SECY(7) are inputted. The signals SECY(0) to SECY(7) are the signals obtained by decoding the column address coladd.

The bit line M3J(0) is connected to two switching bit lines M1J(0) and M1J(4) via transistors Q29 and Q31, to which signals SECY(0) and SECY(4) are inputted, respectively. The bit line M1J(0) is connected to the drain-source node between the flash cells CJ0 and CJ1, and the bit line M1J(4) is connected to the drain-source node between the flash cells CJ4 and CJ5. In the same manner, the bit line M3J(1) is connected to the bit line M1J(1) and M1J(5) via transistors Q21 and Q22, the bit line M3J(2) is connected to the bit lines M1J(2) and M1J(6) via transistors Q30 and Q32, and the bit line M3J(3) is connected to the bit lines M1J(3) and M1J(7) via transistors Q23 and Q24. In this manner, each of the signals SECY(0) to SECY(7) selectively connect either one of the switching bit lines to any one of the bit lines M3J(0) to M3J(3).

The global Y-pass gate GPJ serves as a source selector for bit lines M3J(0) to M3J(3) and comprises source selectors SSJ(0) to SSJ(3). The source selectors SSJ(0) to SSJ(3) respectively connect the bit lines M3J(0) to M3J(3) to the grounding line ARVSS or the data line DATAB. These operations are based on the technique of selection of MirrorBit (registered trademark) cell using a virtual ground method.

Incidentally, since configurations of the local Y-pass gate LPK and the global Y-pass gate GPK of the K-block BKK are the same as the configurations of the local Y-pass gate LPJ and the global Y-pass gate GPJ of the J-block BKJ, their detailed explanation will not be given here.

Figure 5:
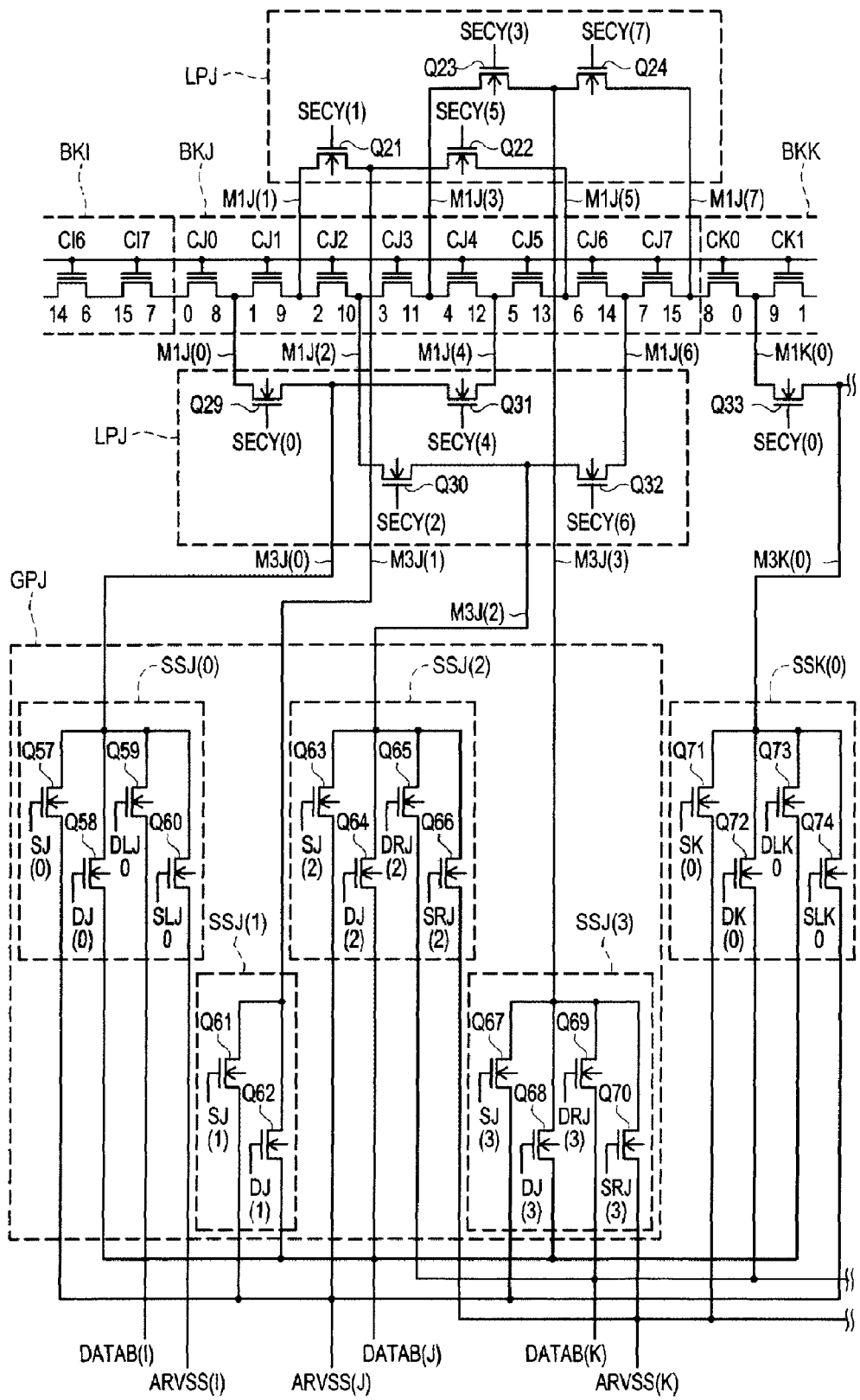
FIG. 5 is a circuit diagram of a J-block BKJ, local Y-pass gate LPJ, a global Y-pass gate GPJ.

FIG. 5 is a detailed circuit diagram of the J-block BKJ, the local Y-pass gate LPJ, and the global Y-pass gate GPJ. It is to be noted that, in the insulating trap layers of eight non-volatile flash cells in the J-block BKJ, the first trap areas, which are adjacent areas of the first diffusion layers, are specified by addresses 8 to 15, and the second trap area, which are adjacent areas of the second diffusion layers are specified by addresses 0 to 7. For instance, the flash cell CJ0 corresponds to column addresses 0 and 8, the flash cell CJ1 corresponds to column addresses 1 and 9, and the flash cell CJ7 corresponds to column addresses 7 and 15. In other words, these addressing relationships are in a relationship of MirrorBit (registered trademark) addressing with reference to each insulating trap layer. Further, the addressing relationship of the J-block BKJ composed of the flash cells CJ0 to CJ7 and the I-block BKI composed of the flash cells CI0 to CI7 is in a mirroring addressing relationship. The addressing relationship of the J-block BKJ composed of the flash cells CJ0 to CJ7 and the K-block BKK composed of the flash cells CK0 to CK7 is in a mirroring addressing relationship.

Next, the global Y-pass gate GPJ will be explained. The source selector SSJ(0) comprises transistors Q57, Q58, Q59 and Q60, of which gates receive signals SJ(0), DJ(0), DLJ0 and SLJ0, respectively. One end of each of the transistors Q57, Q58, Q59 and Q60 are connected in common to the bit line M3J(0). Other ends of the transistors Q57, Q58, Q59 and Q60 are respectively connected to the grounding line ARVSS (J), the data line DATAB(J), the data line DATAB(I), and the grounding line ARVSS(I). Here, the data line DATAB(J) and the grounding line ARVSS(J) are used for reading sixteen bits stored in the flash cells CJ0 to CJ7 in the J-block BKJ. Also, the data line DATAB(I) and the grounding line ARVSS(I) are used for reading sixteen bits stored in the flash cells CI0 to CI7 in the I-block BKI adjacent to the J-block BKJ. The signal SJ(0) connects the bit line M3J(0) to the grounding line ARVSS(J), the signal SLJ0 connects the bit line M3J(0) to the grounding line ARVSS(I), the signal DJ(0) connects the bit line M3J(0) to the data line DATAB(J), and the signal DLJ0 connects the bit line M3J(0) to the data line DATAB(I).

In the same manner, either one of the data line DATAB(J) or the grounding line ARVSS(J) is selected and connected to the bit line M3(J) in the source selector SSJ(1). Also in the source selector SSJ(2), any one of the data line DATAB(J), the data line DATAB(K), the grounding line ARVSS(J), and the grounding line ARVSS(K) is selected and connected to the bit line M3J(2). Also in the source selector SSJ(3), any one of the data line DATAB(J), the data line DATAB(K), the grounding line ARVSS(J), and the grounding line ARVSS(K) is selected and connected to the bit line M3J(3). Here, the data line DATAB(K) and the grounding line ARVSS(K) are used for reading sixteen bits stored in the flash cells CK0 to CK7 in the K-block BKK.

Incidentally, since configurations of the local Y-pass gate LPK and the global Y-pass gate GPK of the K-block BKK are the same as the configurations of the local Y-pass gate LPJ and the global Y-pass gate GPJ of the J-block BKJ, their detailed explanation will not be given here.

Next, an operation of the non-volatile memory device 1 will be explained. In the non-volatile memory device 1, the bit line MI may serve as either one of a source or a drain in accordance with a flash cell to be read out. To minimize the interactions between the flash cells on the common word line WL and to prevent occurrence of leakage current by way of the adjacent flash cell transistors, an access method of applying the same bias to the diffusion layer of the flash cell to be accessed and the outside diffusion layer thereof is employed. Accordingly, when much leakage current is generated, current on a target bit line can be accurately detected by applying bias further to the adjacent bit lines.

Figure 6:
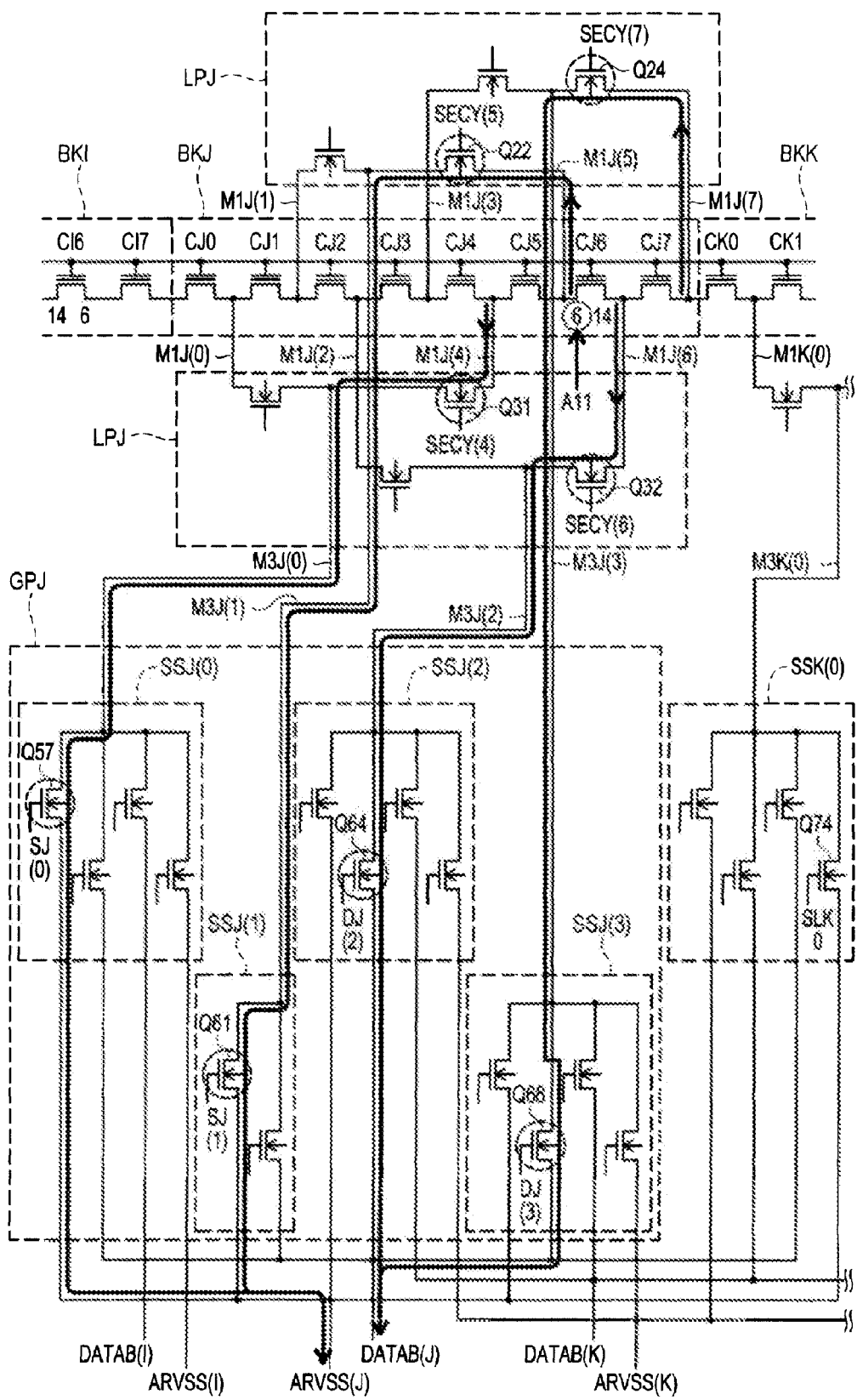
FIG. 6 is an illustration of an operation when a column address coladd indicates address 6.

Referring to FIG. 6, there will be explained an operation when the column address coladd indicates address 6. In this time, the flash cell CJ6 is to be accessed in the J-block BKJ (see arrow A11 of FIG. 6). The flash cell CJ6 is not located at the pattern boundary of the J-block BKJ.

Next, an operation of the booster controller circuit 10 will be explained referring to the circuit diagrams of FIGS. 2 and 3, and the timing chart of FIG. 7. During an operation of the non-volatile memory device 1, the boost enable signal BEN is maintained at high level. Accordingly, the NOR gates NR1 and NR2 are activated (FIG. 2). When the column address indicating address 6 (coladd(0), (3)=low, coladd(1), (2)=high) is inputted to the booster controller circuit 10, the kick signal KICK1 outputted from the NOR gate NR1 makes transition from low level to high level since the lowest-order column address coladd(0) is in a low level (see arrow A1 of FIG. 7). Also, when the column address indicating address 6 is inputted to the NAND gate ND1, the kick signal KICK0 is maintained at high level (see arrow A1 of FIG. 7).

In accordance with the transition of the kick signal KICK1 to high level, the circuit in the boosting system B1 (FIG. 3) is activated and the clock signals CLK1 to CLK3 are generated by the generation unit 21 in the boosting system B1. When the clock signals CLK1 to CLK3 are maintained at high level, the capacitors C1 to C3 in the boosting stages BS1 to BS3 are charged to a power supply voltage VCC level. Next, when the clock signals CLK1 to CLK3 make transition from high level to low level, the capacitors C1 to C3 individually charged to the power supply voltage VCC level are serially connected between the node K1 in the first stage and the output terminal TOUT1 in the boosting system B1, and thereby power supply voltage multiplied by (number of boosting stages+1) is generated at one end of the capacitor C3 in the last stage. Also in a switch SW1 of the switch unit 22, the output terminal TOUT1 is selected in response to the kick signal KICK1 at high level. In this manner, the electric charge boosted by the boosting system B1 is outputted as the boost level BLV via the switch unit 22.

The boost level BLV is inputted to the level shifting circuit 30 (FIG. 1). The level shifting circuit 30 level-shifts the decode signal group DSL at a VCC amplitude of low level outputted from the Y-decoder 40 to the decode signal group DS at a boost level BLV amplitude level so as to supply to the main circuit 50.

Next, an operation in the local Y-pass gate LPJ will be explained. In the local Y-pass gate LPJ, the signals SECY(4), (5), (6) and (7) make transition to high level and then, as shown in the circled areas in FIG. 6, whereby the transistors Q31, Q22, Q32 and Q24 are brought into conduction. Then, the two bit lines M1J(5) and M1J(6) adjacent to the flash cell CJ6, and the bit lines M1J(4) and M1J(7) located outside of said two adjacent bit lines are selected for reading out the flash cell CJ6. The bit lines M1J(5) and M1J(6) are used for supplying basic sensing current in the flash cell CJ6, and the bit lines M1J(4) and M1J(7) are used for accurately detecting current on the target bit line with leakage current being suppressed. As described above, four transistors are driven in the local Y-pass gate LPJ (FIG. 10).

Next, an operation in the global Y-pass gate GPJ will be explained. The source selectors SSJ(0), SSJ(1), SSJ(2) and SSJ(3) respectively receive high level signals SJ(0), SJ(1), DJ(2) and DJ(3) and subsequently the transistors Q57, Q61, Q64 and Q68 are brought into conduction as shown in the circled areas in FIG. 6.

Then, the bit line M1J(5), which is connected to the second diffusion layer of the flash cell CJ6 to be read out, is connected to the grounding line ARVSS(J) via the bit line M3J(1) and the transistor Q61. Also, the bit line M1J(6), which is connected to the first diffusion layer of the flash cell CJ6, is connected to the data line DATAB(J) via the bit line M3J(2) and the transistor Q64. Also, the bit line M1J(4), which is connected to the second diffusion layer of the flash cell CJ5 adjacent to the flash cell CJ6, is connected to the grounding line ARVSS(J) via the bit line M3J(0) and the transistor Q57. Further, the bit line M1J(7), which is connected to the first diffusion layer of the flash cell CJ7 adjacent the flash cell CJ6, is connected to the data line DATAB(J) via the bit line M3J(3) and the transistor Q68. In this manner, an access method of applying the same bias to the diffusion layer of the CJ6 to be accessed and the diffusion layer outside of said diffusion layer is carried out. As described above, four transistors are driven in the global Y-pass gate GPJ (FIG. 10).

As described above, when the column address coladd indicates address 6, eight transistors are driven in total in the local Y-pass gate LPJ and the global Y-pass gate GPJ. Since the number of transistors driven in the local Y-pass gate LPK and the global Y-pass gate GPK in the K-block BKK is eight as in the same case with the J-block BKJ, a detailed explanation on an operation therein will not be given here.

Figure 8:
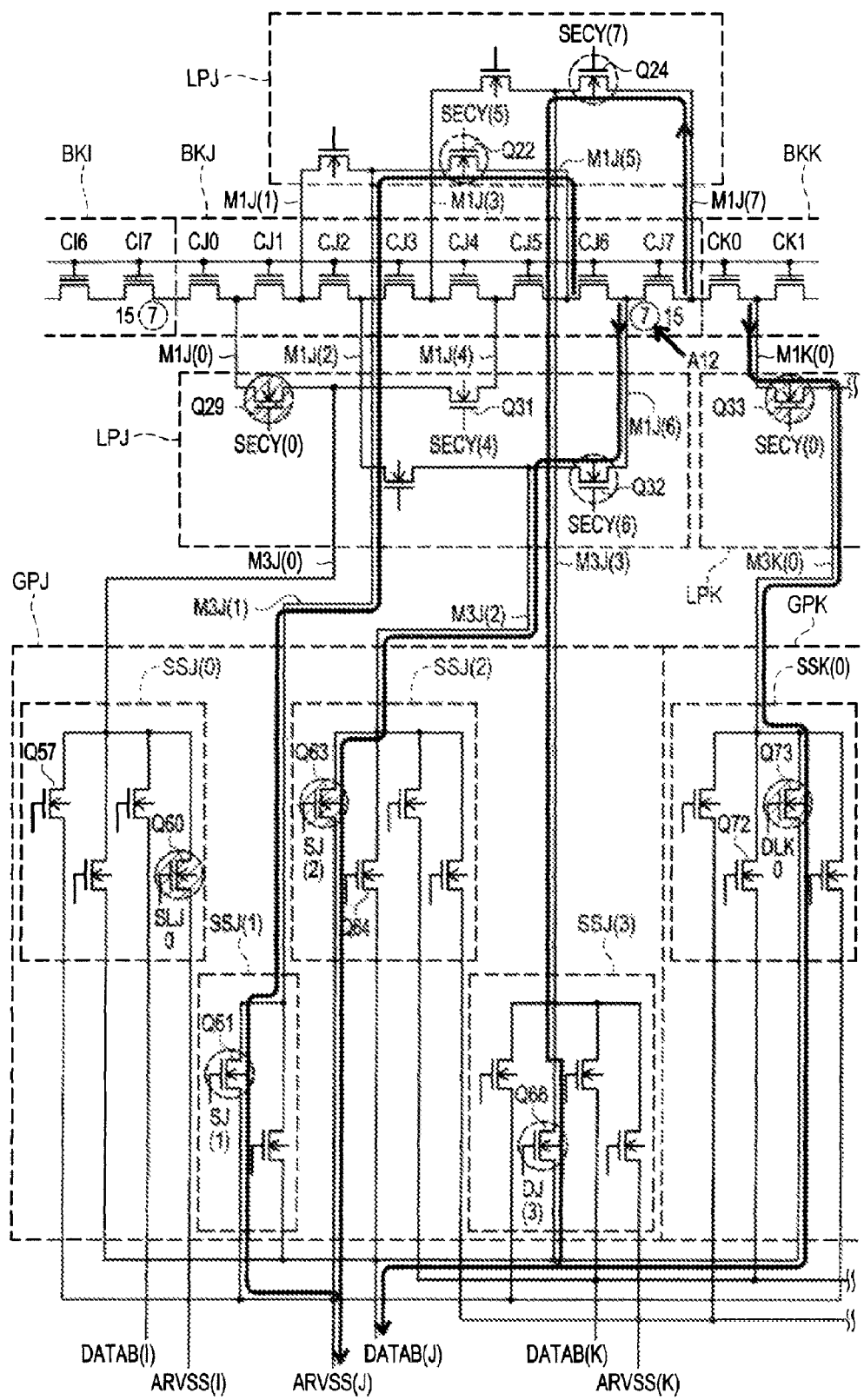
FIG. 8 is an illustration of an operation when the column address coladd makes transition from address 6 to 7.

Next, referring to FIG. 8, an operation when the column address coladd makes transition from address 6 to 7 will be explained. In this time, the flash cell CJ7, which is located at the pattern boundary of the J-block BKJ, is to be accessed in the J-block BKJ (see arrow A12 of FIG. 8).

Figure 7:
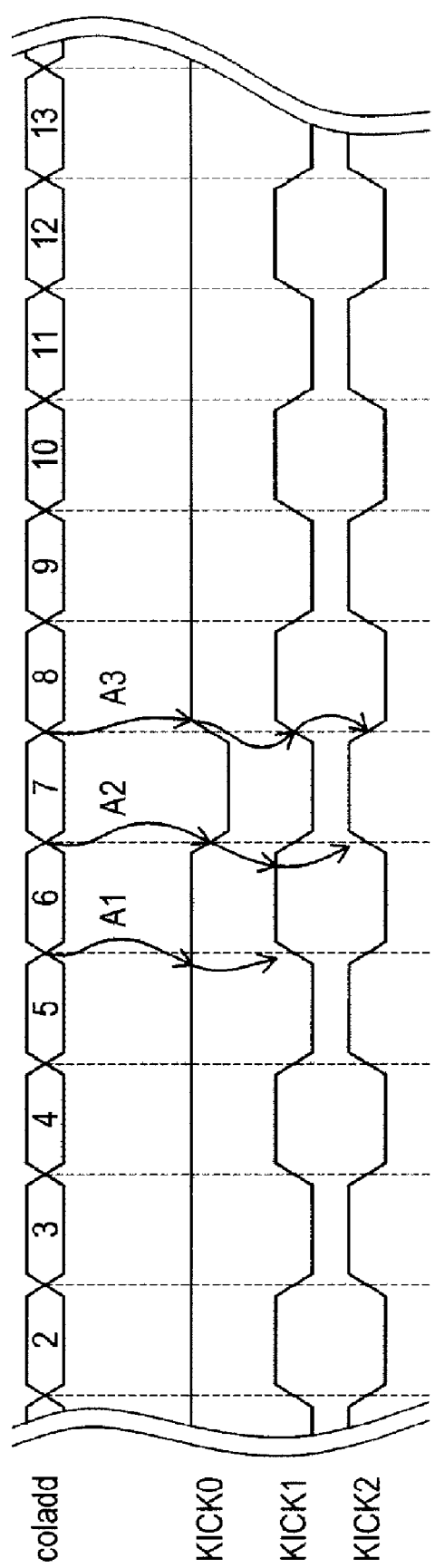
FIG. 7 is a timing chart of the booster controller circuit 10.

When the column address coladd indicating address 7 (coladd(0), (1) and (2)=high, coladd(3)=low) is inputted to the booster controller circuit 10, the kick signal KICK2 outputted from the NOR gate NR2 makes transition from low level to high level since the lowest-order column address coladd(0) is at high level and the kick signal KICK1 from the NOR gate NR1 makes transition from high level to low level (see arrow A2 of FIG. 7). Further, when the column address indicating address 7 is inputted to the NAND gate ND1, the kick signal KICK0 makes transition to low level (see arrow A2 of FIG. 7).

In accordance with the transition of the kick signal KICK2 to high level, the circuit in the boosting system B2 (FIG. 3) is activated and a boosted voltage is generated from the boosting system B2. Also in the switch SW1 of the switch unit 22, the output terminal TOUT2 is selected in response to the kick signal KICK2 at low level. In this manner, an electric charge boosted by the boosting system B2 is outputted as the boost level BLV via the switch unit 22. The boost level BLV is inputted to the level shifting circuit 30 (FIG. 1), from which the decode signal group DS level-shifted to boost level BLV amplitude is outputted.

Next, an operation in the local Y-pass gate LPJ will be explained. In the local Y-pass gate LPJ, when the column address coladd makes transition from address 6 to 7, SECY (0) makes transition to high level while SECY(4) makes transition to low level. Accordingly, as shown in the hatched areas in FIG. 8, the transistor Q29 instead of the transistor Q31 is brought into conduction state. In other words, one of the transistors in the local Y-pass gate LPJ is switched. Also in the local Y-pass gate LPK in the K-block BKK, as shown in the hatched area in FIG. 8, switching is carried out so as to bring the transistor Q33 into conduction. As described above, four transistors are driven in the local Y-pass gate LPJ (FIG. 10).

Next, an operation in the global Y-pass gate GPJ will be explained. The source selectors SSJ(0), SSJ(1), SSJ(2) and SSJ(3) of the global Y-pass gate GPJ respectively receive high level signals SLJ0, SJ(1), SJ(2) and DJ(3). Subsequently, the transistor Q60 is brought into conduction instead of the transistor Q57 and the transistor Q63 is brought into conduction instead of the transistor Q64 as shown in the hatched areas in FIG. 8. In other words, two of the transistors in the global Y-pass gate GPJ are switched. Also the source selector SSK (0) in the global Y-pass gate GPK in the K-block BKK receives the high level signal DLK0. Then, as shown in the hatched area in FIG. 8, the transistor Q73 is brought into conduction instead of the transistor Q72. In this manner, four transistors are driven in the global Y-pass gate GPJ (FIG. 10).

Then, the bit line M1J(6), which is connected to the second diffusion layer of the flash cell CJ7 to be read out, is connected to the grounding line ARVSS(J) via the bit line M3J(2) and the transistor Q63. Also, the bit line M1J(7), which is connected to the first diffusion layer of the flash cell CJ7, is connected to the data line DATAB(J) via the bit line M3J(3) and the transistor Q68. Also, the bit line M1J(5), which is connected to the second diffusion layer of the flash cell CJ6 adjacent to the flash cell CJ7, is connected to the grounding line ARVSS(J) via the bit line M3J(1) and the transistor Q61. Further, the bit line M1K(0), which is connected to the first diffusion layer of the flash cell CK0 adjacent to the flash cell CJ7, is connected to the data line DATAB(J) via the bit line M3K(0) and the transistor Q73.

In this time, the local Y-pass gate LPK and the global Y-pass gate GPK in the adjacent K-block BKK are used for reading out the flash cell CJ7 of the J-block BKJ. That is to say, the flash cells CJ2 to CJ6 which are not located at the pattern boundary of the J-block BKJ can be accessed by way of only the local Y-pass gate LPJ and the global Y-pass gate GPJ in its own block. However, the flash cells CJ0, CJ1, and CJ7 located at the vicinity of the pattern boundary of the J-block are accessed by way of the local Y-pass gate and the global Y-pass gate in the adjacent block.

Incidentally, if the main circuit 50 is configured in a manner such that the flash cells CJ0, CJ1 and CJ7 located at the vicinity of the pattern boundary of the J-block BKJ are accessed by way of the local Y-pass gate LPJ and the global Y-pass gate GPJ, a redundant pass gate needs to be provided only for accessing the flash cells CJ0, CJ1 and CJ7. Therefore, by using the local Y-pass gate and the global Y-pass gate in the adjacent block when accessing the flash cells CJ0, CJ1 and CJ7 located at the vicinity of the pattern boundary, a redundant pass gate does not need to be provided. Accordingly, it is possible to employ an access method of applying the same bias to the diffusion layer located outside of the flash cell to be accessed while reducing the number of pass gates and increasing integration level.

As described above, the total number of transistors to be switched in the local Y-pass gate LPJ and the global Y-pass gate GPJ when the column address coladd makes transition from address 6 to 7 is three (the transistors Q29, Q60 and Q63). It is to be noted that, when the column address coladd makes transition from address 6 to 7, the number of transistors to be switched in the local Y-pass gate LPK and the global Y-pass gate GPK in the K-block BKK is three as in the case with the J-block BKJ. So, a detailed explanation on an operation therein will not be given here.

Figure 9:
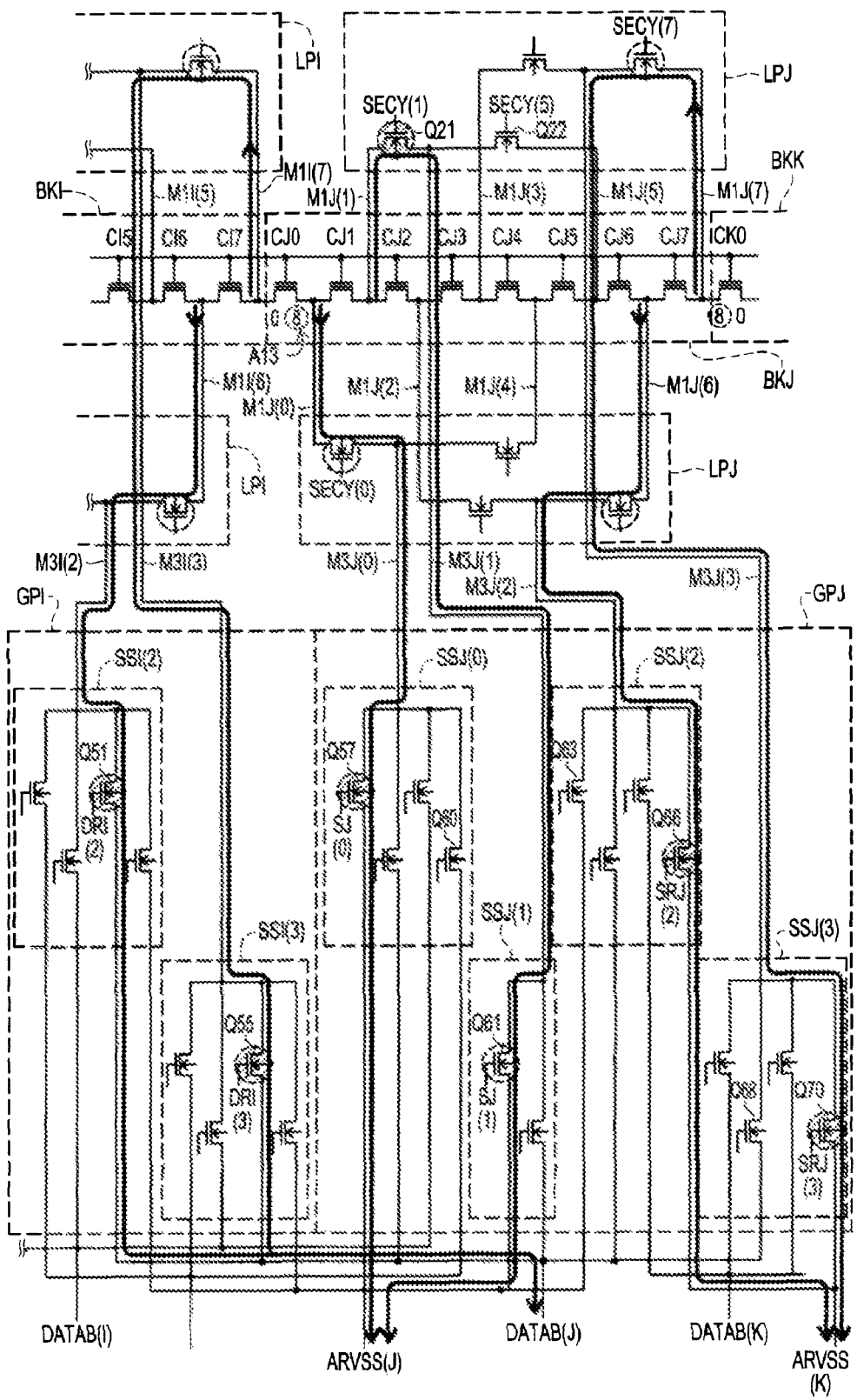
FIG. 9 is an illustration of an operation when the column address coladd makes transition from address 7 to 8.

Next, referring to FIG. 9, an operation when the column address coladd makes transition from address 7 to 8 will be explained. In this time, a cell to be accessed makes transition from the flash cell CJ7 located at the right end of the J-block BKJ to the flash cell CJ0 located at the left end of the J-block BKJ (see arrow A13 of FIG. 9), that is, a non-sequential access operation is carried out.

When the column address coladd indicating address 8 (coladd(0) to (2)=low, coladd(3)=high) is inputted to the booster controller circuit 10, the kick signal KICK1 outputted from the NOR gate NR1 make transition from low level to high level and the kick signal KICK2 outputted from the NOR gate NR2 make transition from high level to low level since the lowest-order column address coladd(0) is at low level (see arrow A3 of FIG. 7). Further, when the column address indicating address 8 is inputted to the NAND gate ND1, the kick signal KICK0 makes transition from low level to high level (see arrow A3 of FIG. 7). That is, the kick signals KICK0 and KICK 1 both make transition to high level when the column address coladd makes transition from address 7 to 8.

In accordance with the transition of the kick signals KICK0 and KICK1 to high level, both of the circuits in the boosting systems B0 and B1 (FIG. 3) are activated and boosted voltages are outputted from the boosting systems B0 and B1. Also in the switch unit 22, the output terminal TOUT0 is selected in response to the kick signal KICK0 at high level and the output terminal TOUT1 is selected in response to the kick signal KICK1 at high level. In this manner, the boosting systems B0 and B1 are parallel connected and the boosted voltage is outputted as the boost level BLV via the switch unit 22. Then, the boost level BLV is inputted to the level shift circuit 30 (FIG. 1), from which the decode signal group DS level-shifted to the boost level BLV amplitude is outputted.

In other words, in accordance with the transition of the column address coladd from address 7 to 8, the boosting system B0 is activated as well as the boosting system B1. In other patterns of address transition, the boosting systems B1 and B2 are activated alternately and the boosting system B0 is not activated. Therefore, only in the transition of the column address coladd from address 7 to 8, a current driving capacity to the load circuit is enlarged.

Next, an operation in the local Y-pass gate LPJ will be explained. In the local Y-pass gate LPJ, when the column address coladd makes transition from address 7 to 8, SECY(1) makes transition to high level while SECY(5) makes transition to low level. As shown in the hatched area, the transistor Q21 is brought into conduction instead of Q22. Accordingly, four transistors are driven in the local Y-pass gate LPJ. In other words, one of the transistors in the local Y-pass gate LPJ is switched (FIG. 10).

Next, an operation in the global Y-pass gate GPJ will be explained. The source selectors SSJ(0), SSJ(1), SSJ(2) and SSJ(3) of the global Y-pass gate GPJ respectively receive high level signals SJ(0), SJ(1), SRJ(2) and SRJ(3). Subsequently, the transistor Q57 is brought into conduction instead of Q60, the transistor Q66 is brought into conduction instead of Q63, and the transistor Q70 is brought into conduction instead of Q68, as shown in the hatched areas in FIG. 9. In this manner, four transistors are driven in the global Y-pass gate GPJ. In other words, three of the transistors in the global Y-pass gate GPJ are switched (FIG. 10).

In a similar way, source selectors SSI(2) and SSI(3) of the global Y-pass gate GPI receive high level signals DRI(2) and DRI(3), respectively. Thus, as shown in the hatched areas in FIG. 9, the transistors Q51 and Q55 are brought into conduction.

Subsequently, a bit line M1J(0) connected to the second diffusion layer of the flash cell CJ0 to be read out is connected with the grounding line ARVSS(J) via the bit line M3J(0) and the transistor Q57. Also, a bit line M1I(7) connected to the first diffusion layer of the flash cell CJ0 is connected with the data line DATAB(J) via the bit line M3I(3) and the transistor Q55. Also, a bit line M1J(1) connected to the second diffusion layer of the flash cell CJ1 is connected with the grounding line ARVSS(J) via the bit line M3J(1) and the transistor Q61. Also, a bit line M1I(6) connected to the first diffusion layer of the flash cell CI7 is connected with the data line DATAB(J) via a bit line M3I(2) and the transistor Q51.

During the operation, local Y-pass gate LPI and source selectors SSI(2) and SSI(3) of a global Y-pass gate GPI of the I-block BKI adjacent to the J-block BKJ are used for reading out the flash cell CJ0 located at the vicinity of the pattern boundary of the J-block BKJ. Accordingly, it is possible to employ an access method of applying the same bias to the diffusion layer located outside of the flash cell to be accessed while reducing the number of pass gates and increasing integration level.

Also, in reading out the flash cell CK0 located at the vicinity of the pattern boundary of the K-block BKK, the local Y-pass gate LPJ and source selectors SSJ(2) and SSJ(3) of the global Y-pass gate GPJ of the J-block BKJ adjacent to the K-block BKK are used. Accordingly, a redundant pass gate does not need to be provided also in the K-block BKK.

As described above, the total number of transistors which are switched in the local Y-pass gate LPJ and the global Y-pass gate GPJ when the column address coladd makes transition from address 7 to 8 is four (the transistors Q21, Q57, Q66 and Q70). In other words, when the column address coladd makes transition from address 7 to 8, the number of transistors to be switched is one more than other patterns of address transition, that is, as shown in FIG. 10, the load increment is increases by one.

Next, there will be explained the reason why the number of transistors to be switched differs depending on column addresses coladd. In a burst operation, there are two types of operations: a sequential access operation to access adjacent flash cells one by one; and a non-sequential access operation to as access from a memory cell located at one end of a block to a memory cell located at the other end of the block. In the sequential access operation by the four-column selection access method of applying the same bias to the diffusion layer of the flash cell to be accessed and the diffusion layer located outside thereof, one additional bit line must be selected for a newly accessed flash cell, as well as connection point of the bit line common with the preceding flash cell and the next flash cell must be switched between a data line DATAB and a grounding line ARVSS. Thus, one transistor must be operated in local Y-pass gate and two transistors in a global Y-pass gate, that is, three transistors must be operated in total.

However, in a non-sequential access operation by a multi-column selection access method, connection point of a bit line must be switched between to a data line DATAB and to a grounding line ARVSS, because the flash cells CJ0 and CJ7 located at the vicinity of the pattern boundary are addressed in a mirroring manner. Thus, at least four transistors must be operated in local Y-pass gate and a global Y-pass gate. That is, the number of transistors to be operated differs between in a sequential access operation and a non-sequential access operation. Since non-sequential-mannered allocation of physical addresses causes a non-sequential access operation, predetermined pattern of transition of column address coladd causes a non-sequential access operation. Thus, in accordance with the transition of column address coladd, load capacity of the local Y-pass gate and the global Y-pass gate varies. These characteristics are shown in FIG. 10.

Therefore, by providing the booster circuit 20 which accelerates driving ability of the local Y-pass gate and the global Y-pass gate in accordance with detection result of the booster controller circuit 10, it becomes possible to make a non-volatile memory device to have a driving ability appropriate to a sequential access during a sequential access operation where load capacity of a local Y-pass gate and a global Y-pass gate produce becomes small, and enlarge the driving ability during a non-sequential access operation where the load capacity of the local Y-pass gate and the global Y-pass gate becomes large.

As can be seen from the above explanation, according to the embodiment, it is possible to increase or decrease driving ability of a booster circuit in accordance with the load capacity of a local Y-pass gate and a global Y-pass gate which varies in accordance with column address coladd. This prevents loss of consumption current caused by excessive boosting, thereby achieving low power consumption. Also, adjusting time for further regulating the excessively boosted voltage to a predetermined voltage becomes unnecessary so that speeding up of burst access can be achieved.

It is to be noted that the present invention is not restricted to the above-described embodiment, but needless to say, may be improved or modified in various ways within a scope not departing from the present invention. In the embodiment, the four-column access method of applying the same bias to the diffusion layer of the flash cell to be accessed and the diffusion layer outside thereof has been explained, however, the invention is not restricted to the embodiment. For instance, the invention can be applied to a three-column selection access method of applying the same bias only to a target diffusion layer of the flash cell to be accessed and the adjacent target diffusion layer located outside thereof. It is also possible to employ a six-column selection access method by four auxiliary bit lines so as to further prevent leakage current.

When such access method is employed, by using the local Y-pass gate and the global Y-pass gate of the adjacent block in accessing the flash cells CJ0, CJ1, CJ2, CJ6 and CJ7 located at the vicinity of the pattern boundaries of the J-block BKJ, a redundant pass gate can become unnecessary. It is needless to say that the driving ability of the booster circuit can be increased or decreased in accordance with variation of the load capacity of the Y-pass gates, which is peculiar effect of the invention.

It is also to be noted that the booster controller circuit 10 and the booster circuit 20 are examples of a control circuit, the local Y-pass gates LPI to LPL, the global Y-pass gates GPI to GPL are examples of a selector circuit, the NAND gate ND1 is an example of a detector circuit, the booster circuit 20 is an example of an internal power supply circuit, the boosting systems B1 and B2 are examples of main power supply circuits, and the boosting system B0 is an example of a sub-power supply circuit.

What is claimed is:

1. A non-volatile memory device comprising plural memory cells connected in series,
    wherein a unit of memory block with the plural memory cells is defined by a boundary at which address allocation regularity of the plural memory cells changes from a shifting manner to a mirroring manner, and
    the non-volatile memory device further comprises a control circuit which varies driving ability of a selector transistor which selects a diffusion layer in a selected memory cell and a diffusion layer of at least one non-selected memory cell which adjoins to the selected memory cell when the selected memory cell makes transition from a memory cell at one end to a memory cell at other end within the memory block.

2. A non-volatile memory device according to claim 1, wherein the selector transistor selects:
    a first diffusion layer of the selected memory cell and a second diffusion layer of the non-selected memory cell; or
    a second diffusion layer of the selected memory cell and a first diffusion layer of the non-selected memory cell.

3. A non-volatile memory device according to claim 2, wherein the selector transistor connects:
    both a target bit line to be connected to a target diffusion layer which is targeted when a burst access readout operation is applied to either the first diffusion layer or the second diffusion layer and at least one adjoining target bit line which adjoins to the target bit line to a first potential; and
    a non-target bit line which exists in a memory cell inclusive of the target diffusion layer and connected to a non-target diffusion layer to be paired with the target diffusion layer to a second potential.

4. A non-volatile memory device according to claim 1, wherein the control circuit comprises a decoder which detects a predetermined address.

5. A non-volatile memory device according to claim 4, wherein the predetermined address corresponds to a most significant bit.

6. A non-volatile memory device according to claim 4, wherein the predetermined address corresponds to a point at which the address allocation regularity is switched to the mirroring manner from the shifting manner.

7. A non-volatile memory device according to claim 1, wherein the control circuit comprises an internal power supply circuit which comprises:
    a main power supply circuit which supplies main electric power during a burst access readout operation; and
    a sub power supply circuit which supplies sub electric power in addition to the main electric power in response to a detection operation to be taken when the selected memory cell makes transition from a memory cell at one end to a memory cell at other end within the memory block.

8. A non-volatile memory device according to claim 7, wherein the main power supply circuit comprises plural charge pumps which are controlled respectively at opposite phase in response to a least significant bit of an address signal.

9. A non-volatile memory device according to claim 7, wherein the sub power supply circuit comprises a charge pump which is controlled in response to the detection operation.

10. A non-volatile memory device according to claim 1, wherein the selector transistor corresponds to a column selector switch.

11. A non-volatile memory device according to claim 1,
    wherein each of the plural memory cells comprises a first diffusion layer, a second diffusion layer, and an insulating trap layer which comprises a first trap region and second trap region adjoining to the first diffusion layer and the second diffusion layer, respectively, for trapping charges,
    the plural memory cells being connected to one another in such a manner that, between two memory cells adjoining to each other, a first diffusion layer of one of the two memory cells and a second diffusion layer of other one of the two memory cells are connected to a bit line,
    the non-volatile memory device further comprises:
    a selector circuit connects: both a target bit line to be connected to a target diffusion layer which is targeted when a burst access readout operation is applied to either the first diffusion layer or the second diffusion layer and at least one adjoining target bit line which adjoins to the target bit line to a first potential; and a non-target bit line which exists in a memory cell inclusive of the target diffusion layer and connected to a non-target diffusion layer to be paired with the target diffusion layer to a second potential;

a detector circuit which detects that a readout access makes transition from a memory cell at one end to a memory cell at other end within the memory block during the burst access readout operation; and an internal power supply circuit of which supply ability to supply electric power to the selector circuit is increased depending on a detection result of the detector circuit.

12. A control method of a non-volatile memory device comprising plural memory cells connected in series, when a unit of memory block in the plural memory cells is defined by a boundary at which address allocation regularity of the plural memory cells changes from a shifting manner to a mirroring manner, the control method comprising a step of varying driving ability of a selector transistor which selects a diffusion layer in a selected memory cell and a diffusion layer of at least one non-selected memory cell which adjoins to the selected memory cell when the selected memory cell makes transition from a memory cell at one end to a memory cell at other end within the memory block.

13. A non-volatile memory system comprising:

plural memory blocks each of which is a unit defined by a boundary at which address allocation regularity of the plural memory cells connected in series changes from a shifting manner to a mirroring manner; and a control circuit which varies driving ability of a selector transistor which selects a diffusion layer in a selected memory cell and a diffusion layer of at least one non-selected memory cell which adjoins to the selected memory cell when the selected memory cell makes transition from a memory cell at one end to a memory cell at other end within the memory block.

\* \* \* \* \*